United States Patent
Shirley

Patent Number: 6,061,290
Date of Patent: *May 9, 2000

[54] METHOD AND APPARATUS FOR SIMULTANEOUS MEMORY SUBARRAY TESTING

[75] Inventor: Brian M. Shirley, Boise, Id.

[73] Assignee: Micron Technology, Inc., Boise, Id.

[*] Notice: This patent is subject to a terminal disclaimer.

[21] Appl. No.: 09/250,593

[22] Filed: Feb. 16, 1999

Related U.S. Application Data

[63] Continuation of application No. 08/885,535, Jun. 30, 1997, Pat. No. 5,883,849.

[51] Int. Cl.⁷ .................................................. G11C 8/00
[52] U.S. Cl. .............. 365/230.02; 365/201; 365/230.03; 365/189.02
[58] Field of Search ................... 365/230.02, 189.01, 365/189.03, 189.02, 203, 230.03

[56] References Cited

U.S. PATENT DOCUMENTS

| | | | |
|---|---|---|---|
| 5,208,779 | 5/1993 | Walther et al. | 365/222 |
| 5,291,443 | 3/1994 | Lim | 365/189.04 |
| 5,335,201 | 8/1994 | Walther et al. | 365/222 |
| 5,335,202 | 8/1994 | Manning et al. | 365/222 |
| 5,390,149 | 2/1995 | Vogley et al. | 365/189.01 |
| 5,394,172 | 2/1995 | McLaury | 345/200 |
| 5,506,810 | 4/1996 | Runas | 365/230.03 |
| 5,594,474 | 1/1997 | McLaury | 345/203 |
| 5,617,555 | 4/1997 | Patel et al. | 395/432 |
| 5,627,791 | 5/1997 | Wright et al. | 365/222 |
| 5,749,086 | 5/1998 | Ryan | 711/105 |
| 5,883,849 | 3/1999 | Shirley | 365/230.02 |

Primary Examiner—David Nelms
Assistant Examiner—David Lam
Attorney, Agent, or Firm—Schwegman, Lundberg, Woessner & Kluth, P.A.

[57] ABSTRACT

One row of memory cells per sense amplifier bank on a multiple subarray dynamic random access memory (DRAM) are fired while in a test mode. Multiplexors are provided on local I/O lines to ensure that the local I/O lines are not connected to global I/O lines when multiple rows are fired. This provides protection for I/O circuitry not designed to handle the load of multiple local I/O lines coupled in parallel. The multiplexors are controlled by a multiplexor control signal which is separate from row and column decode signals. During a refresh/hammer test, such rows are fired as many times as possible during a refresh period. Then adjacent rows are tested to determine if they were affected by the firing. During the firing, the multiplexors effectively isolate global I/O lines from local I/O lines.

50 Claims, 2 Drawing Sheets

METHOD AND APPARATUS FOR SIMULTANEOUS MEMORY SUBARRAY TESTING

This application is a continuation of U.S. Ser. No. 08/885,535, filed Jun. 30, 1997, now U.S. Pat. No. 5,883,849.

FIELD OF THE INVENTION

The present invention relates to testing of semiconductor based memory devices, and in particular to testing such memory devices having multiple subarrays.

BACKGROUND OF THE INVENTION

Semiconductor memory devices are becoming more and more complex as their size decreases and their storage density increases. To help handle some of the increase in storage density, an architecture comprising multiple subarrays of memory cells for storing values has been adopted in dynamic random access memory (DRAM) devices. Each of the subarrays comprises multiple columns and multiple rows of memory cells. Rows are accessed or "fired" by activation of row address signals. Each column of memory cells in a subarray is coupled to a sense amplifier which in turn is selectively coupled to pairs of I/O lines which are local to each subarray. Sense amplifiers may be coupled to columns of cells in more than one subarray. Multiplexors in gaps between subarrays are used to couple local I/O lines to pairs of global I/O lines, which provide the values for several of the subarrays.

During normal memory operation, the multiplexors are often controlled by a signal that is active only if a row has been fired in that subarray. There are multiple global I/O lines, each one providing data from multiple subarrays. The multiplexors allow only one cell to be coupled through a local I/O line to a global I/O line to prevent conflicting signals from occurring on the global I/O lines. Hence, the control of the multiplexors is tied closely to row decode signals.

This type of architecture has been very helpful in obtaining DRAMs beyond the 16 MB generation. However, as the storage capacity has increased, so have testing times. The same architecture that facilitates higher storage capacities, has also made it time consuming to test the DRAMs by limiting the number of rows that can be fired at any one time. In one type of row disturb test, a row is first written with data, and then accessed or fired and latched as many times as possible during a standard refresh cycle. This simulates a worst case condition to which a customer could subject the DRAM. It may result in rows adjacent to the fired row being affected by noise or leakage mechanisms between the rows. Following this type of test, other data cells, such as those in nearby rows are read to see if they have been affected by the row disturb. When the array comprises an eight by eight subarray arrangement, only the rows of a block of eight subarrays may be fired during this test. That means that the test must be repeated for each row in the subarrays multiplied by eight more subarrays. With 512 rows per subarray, the test is done 8096 times. The time taken just to fire the rows is then 8096 times the refresh rate. This type of testing is usually performed both at the wafer level, and at the final package level at least twice. The large amount of time to test the DRAM requires additional resources per DRAM which increases the cost of the DRAMs.

There is a need to cut down the time it takes to perform row disturb types of testing. There is a need to cut down such time without adding complex circuitry to the DRAM device, which could cut achievable densities. There is yet a further need to reduce the expense associated with testing of DRAM devices.

SUMMARY OF THE INVENTION

One row of memory cells per sense amplifier bank on a multiple subarray dynamic random access memory (DRAM) is fired while in a test mode. This is accomplished in one embodiment by simply ignoring selected portions of the row addresses that select the subarrays. Control circuitry is provided for the I/O multiplexors to ensure that the local I/O lines are not connected to global I/O lines when multiple rows are fired. This provides protection for I/O circuitry not designed to handle the load of multiple local I/O lines coupled in parallel. The multiplexors are controlled by a signal which is separate from row and column decode signals. In one embodiment, the signal is a test signal which is also operative to cause decoding circuitry to ignore the subarray selection portions of the address during test mode.

In a further embodiment, sense amplifiers are interleaved such that they are each used for sensing rows from two arrays. The decoding circuitry, in response to the test signal, ensures that only one row per sense amplifier is fired at any given time. During a refresh/hammer test, such rows are fired as many times as possible during a refresh period. Then adjacent rows are tested to determine if they were affected by the firing. During the firing, the multiplexors effectively isolate global I/O lines from local I/O lines. This is done to prevent summing of signals from the local I/O lines which might have unknown effects on the global I/O line.

By providing the ability to fire multiple row lines in multiple subarrays at the same time during testing, testing times are greatly reduced. This provides a less expensive testing cycle, and does so with little additional circuitry.

DESCRIPTION OF THE EMBODIMENTS

In the following detailed description, reference is made to the accompanying drawings which form a part hereof and in which is shown by way of illustration specific embodiments in which the invention may be practiced. These embodiments are described in sufficient detail to enable those skilled in the art to practice the invention, and it is to be understood that other embodiments may be utilized and that structural logical and electrical changes may be made without departing from the spirit and scope of the present invention. The following detailed description is, therefore, not to be taken in a limiting sense, and the scope of the present invention is defined by the appended claims.

Figure 1:
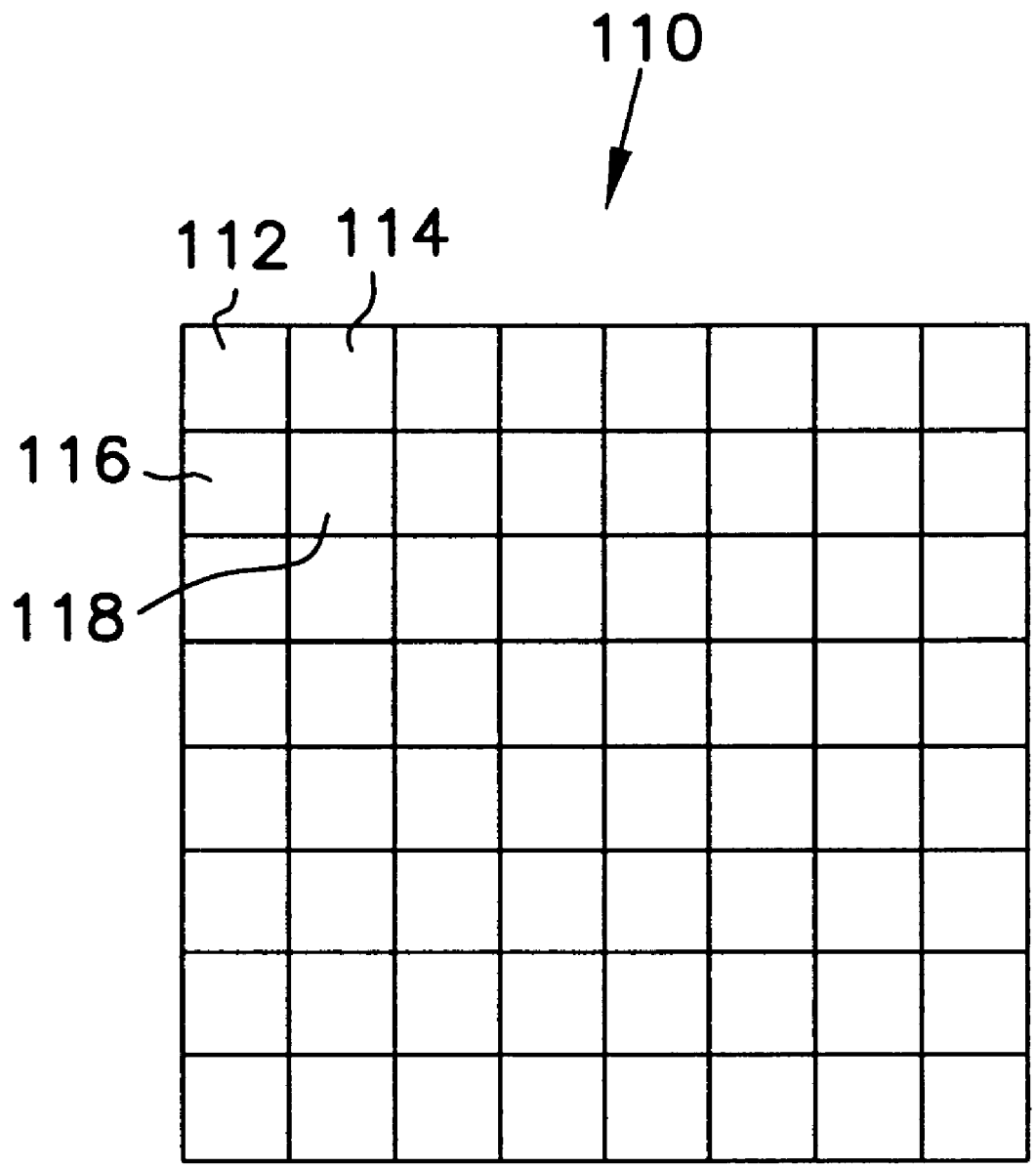
FIG. 1 is a high level block representation of a dynamic random access storage device having multiple subarrays of memory cells.

A dynamic random access memory device (DRAM) is shown generally at 110 in FIG. 1. DRAM 110 comprises multiple subarrays of memory cells, some of which are indicated at 112, 114, 116 and 118. In one embodiment, 64 subarrays, each having 512 rows and columns are used to form a 16 MB array. Four arrays are then combined to form a 64 MB DRAM. Further variations on the number of subarrays and arrays comprising DRAMs of various sizes are within the scope of the present invention.

Figure 2:
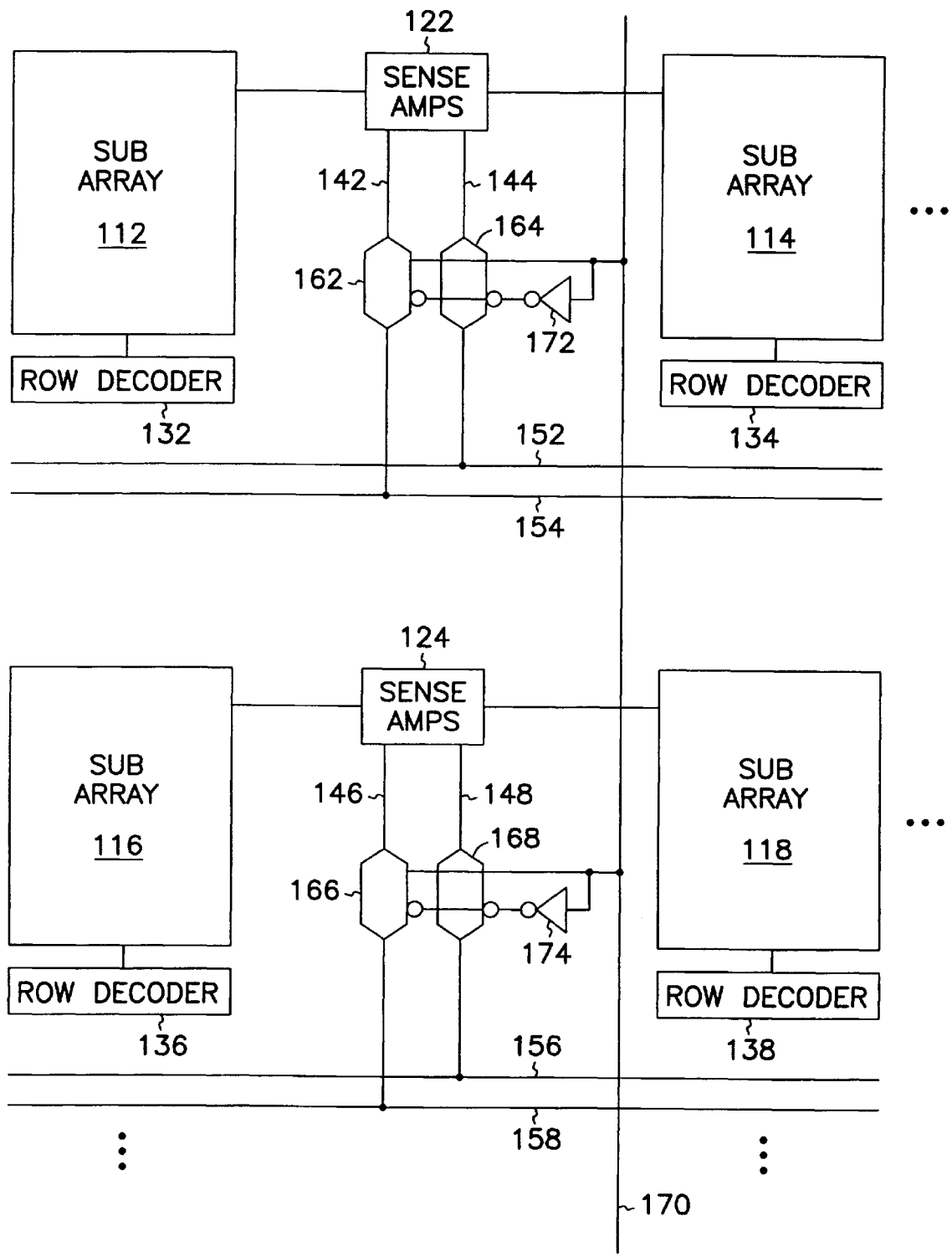
FIG. 2 is a partial block circuit diagram of selected subarrays of the dynamic random access memory of FIG. 1.

A portion of the DRAM 110 is shown in further detail in FIG. 2. Adjacent subarrays 112 and 114 share a bank of sense amplifiers 122. Adjacent subarrays 116 and 118 share a bank of sense amplifiers 124. The sense amplifiers are used to sense and amplify individual values stored in memory cells. Each column in a subarray is coupled to a sense amplifier in the bank of sense amplifiers 124. Each such sense amplifier is commonly coupled to a column of memory cells in an adjacent subarray. Memory cells are selected by firing individual rows of cells via a row decoder 132, 134, 136 and 138 corresponding to each subarray. The sensed and amplified values are provided by the sense amps on local pairs of I/O lines indicated at 142, 144, 146, and 148. The local I/O lines are then coupled to pairs of global 110 lines indicated at 152, 154, 156 and 158. Pairs of multiplexors 162, 164, 166 and 168 are coupled between the local 110 lines and the global I/O lines to selectively gate the signals from the local I/O lines to the global I/O lines under control of a multiplexor control signal on a line 170. In one embodiment, the multiplexors comprise pairs of parallel coupled n and p channel transistors, with the p channel transistors being fed the compliment of the multiplexor control signal via invertors 172 and 174. Further methods of multiplexing the local I/O pairs will be apparent to those skilled in the art.

During normal operation of the memory 110, the decoders decode row addresses and cause only one row of memory cells out of all the rows in all the subarrays is fired, and the multiplexor control signal is in a state to couple the appropriate local I/O lines to the global I/O lines. It should be noted that the global I/O lines shown may be a single contiguous pair of lines, or may be further multiplexed together at a point not shown.

During testing operations, it is desired to fire a row in multiple subarrays at the same time or substantially simultaneously to save testing time. It should be noted that the term simultaneously is used to indicate that there is at least some overlap in the time during which multiple rows are fired. They need not be precisely fired at the same time. In fact, given path length differences, it would be difficult to precisely synchronize them. To do this, the decoders are directed to ignore most of a row address related to selection of the subarray. Each decoder still does some decoding based on the subarray address to ensure that only a row in one of two adjacent subarrays sharing a bank of sense amplifiers is fired at any one time if such sense amplifiers cannot be used at the same time without conflict. It should be noted that local decoders are shown, but a central decoder could also be used.

In a refresh/hammer test, 32 rows in the 64 subarray array are fired at the same time, with the multiplexors preventing coupling to the global I/O lines. Each of the 32 rows is fired, and sensed and amplified by associated sense amplifiers as many times as possible during a single refresh cycle to stress the memory as much as possible. Following this stressing, adjacent rows are sensed to see if they were affected.

The multiplexor control signal is independent of any subarray or sense amp control signal. It may be provided on line 170 by an external testing device during testing and otherwise coupled to allow normal operation of the I/O lines during normal operation. When the testing described above is performed, the multiplexor control signal 170 controls the multiplexors 162, 164, 166 and 168 to isolate the local control lines 142, 144, 146 and 148 from the global control lines 152, 154, 156 and 158. This ensures that the global control lines are not stressed beyond capacity and that no parasitic effects occur. Separating the multiplexor control signal from any subarray or sense amp control signals allows much faster testing of the memory 110. It permits the simultaneous firing of rows of memory cells in multiple subarrays, which in the past had to be fired independently. This results in tremendous savings in time in refresh/hammer tests, which are conducted several times in the manufacturing of DRAM memory.

It is to be understood that the above description is intended to be illustrative, and not restrictive. Many other embodiments will be apparent to those of skill in the art upon reviewing the above description. For example, while the multiplexor control signal is shown as being provided on a single line for all multiplexors, it could easily be a separate signal for each pair of multiplexors. Similarly, other types of multiplexors will work with the present invention. Further, separate banks of sense amps could be provided for each subarray, and the sizes and numbers of subarrays can be varied without departing from the invention. Still further, firing of selected rows could be performed without the decoder having to ignore portions of row addresses.

What is claimed is:

1. A memory array, comprising:
    at least one subarray of a memory having multiple rows of memory elements and a plurality of local I/O lines;
    a multiplexor coupled to at least a portion of the local I/O lines and a global I/O line, the multiplexor operable for isolating the portion of the local I/O lines from the global I/O line when multiple rows of memory elements are accessed.

2. The memory array of claim 1, wherein the multiplexor is responsive to a multiplexor control signal to isolate the portion of the local I/O lines from the global I/O line.

3. The memory array of claim 2, wherein the multiplexor control signal is independent from subarray and sense amp control signals.

4. The memory array of claim 2, wherein the multiplexor control signal is independent from row and column decode signals.

5. The memory array of claim 2, wherein the multiplexor control signal is a test signal which is also operative to cause decoding circuitry to ignore subarray selection portions of a memory cell address.

6. A memory array, comprising:
    a plurality of subarrays each having multiple rows of memory elements;
    a decoder for selecting rows within the plurality of subarrays;
    a plurality of sense amplifiers, each connected to a unique one of the multiple rows of memory elements of each one of the plurality of subarrays;
    a plurality of local I/O lines, each coupled to a unique one of the plurality of sense amplifiers;
    a plurality of multiplexors coupled to at least a portion of the plurality of local I/O lines; and
    at least one global I/O line coupled to the plurality of multiplexors, wherein the plurality of multiplexors isolate at least a portion of the local I/O lines from the global I/O lines.

7. The memory array of claim 6, wherein the plurality of subarrays further comprises a pair of adjacent subarrays, further wherein at least one of the plurality of sense amplifiers is connected to a unique one of the multiple rows of memory elements of each one of the pair of adjacent subarrays.

8. A memory device, comprising:
    a plurality of data pins;

an addressing circuit responsive to addresses; and a memory array connected to the plurality of data pins and the addressing circuit, the memory array comprising:

at least one subarray of a memory having multiple rows of memory elements and a plurality of local I/O lines; and a multiplexor coupled to at least a portion of the local I/O lines and a global I/O line, the multiplexor operable for isolating the portion of the local I/O lines from the global I/O line when multiple rows are substantially simultaneously accessed.

9. The memory device of claim 8, wherein the multiplexor is responsive to a multiplexor control signal to isolate the portion of the local I/O lines from the global I/O line.

10. The memory device of claim 9, wherein the multiplexor control signal is a test signal which is also operative to cause decoding circuitry to ignore subarray selection portions of a memory cell address.

11. A memory device, comprising:

a plurality of data pins;

an addressing circuit responsive to addresses; and a memory array connected to the plurality of data pins and the addressing circuit, the memory array comprising:

multiple subarrays each having multiple rows of memory elements;

a decoder for selecting subarrays and rows within subarrays;

a plurality of sense amplifiers, each sense amplifier being coupled to a memory element in one row from each of two adjacent subarrays that sense and amplify values stored in the memory elements;

a plurality of local I/O lines coupled to the sense amplifiers;

a plurality of multiplexors coupled to the local I/O lines;

at least one global I/O line coupled to the multiplexors; and a multiplexor control line which is independent of subarray selection signals, the multiplexor control line controlling the multiplexors to isolate a portion of the local I/O lines from at least a portion of the global I/O lines when multiple rows are accessed.

12. A memory array, comprising:

plural subarrays, each having multiple rows of memory elements, each row being selected by a row selection signal, and having local I/O lines;

a plurality of multiplexors coupled to the local I/O lines;

a multiplexor control line having a multiplexor control signal which is independent of individual row selection signals; and at least one global I/O line coupled to at least a portion of the multiplexors wherein the at least a portion of the multiplexors isolate at least some of the local I/O lines from the global I/O lines when multiple rows are simultaneously accessed in response to the multiplexor control signal.

13. A method of testing a memory array, comprising:

simultaneously accessing single rows of memory cells in multiple subarrays;

sensing and amplifying the values stored in the memory cells;

providing the values on the local I/O lines; and isolating at least a portion of the local I/O lines from the global I/O lines.

14. The method of claim 13, wherein isolating at least a portion of the local I/O lines comprises isolating at least a portion of the local I/O lines using a multiplexor.

15. The method of claim 13, wherein isolating at least a portion of the local I/O lines comprises isolating at least a portion of the local I/O lines using a multiplexor in response to a multiplexor control signal.

16. The method of claim 13, wherein isolating at least a portion of the local I/O lines comprises isolating at least a portion of the local I/O lines using a multiplexor in response to a multiplexor control signal, wherein the multiplexor control signal is also operative to cause decoding circuitry to ignore subarray selection portions of a memory cell address.

17. A method of testing a dynamic random access memory array, comprising:

selecting single rows of memory cells in multiple subarrays such that no two memory cells in the selected rows share a sense amplifier;

repeatedly firing the selected rows during a predetermined period of time;

sensing and amplifying the values stored in the memory cells each time the selected rows are fired;

providing the values on the local I/O lines;

isolating at least a portion of the local I/O lines from the global I/O lines independently from selection of the subarrays; and sensing values in memory cells in rows adjacent to the rows that were fired.

18. The method of claim 17, wherein the predetermined period of time is a period of time corresponding to a refresh period of the memory array.

19. A memory array, comprising:

a pair of memory subarrays, each having memory cells arranged in rows and columns;

a bank of sense amplifiers coupled between the pair of memory subarrays, wherein each sense amplifier is commonly coupled to one column of a first subarray of the pair of memory subarrays and to one column of a second subarray of the pair of memory subarrays, further wherein each column is coupled to one sense amplifier of the bank of sense amplifiers;

a plurality of local I/O lines coupled to the bank of sense amplifiers;

at least one global I/O line; and at least one multiplexor coupled between the plurality of local I/O lines and the at least one global I/O line, wherein the at least one multiplexor is adapted to selectively isolate the at least one global I/O line from at least a portion of the plurality of local I/O lines carrying sensed and amplified signals from the bank of sense amplifiers.

20. A memory array, comprising:

a plurality of memory subarrays, each having memory cells arranged in rows and columns;

a bank of sense amplifiers coupled between the plurality of memory subarrays, wherein each sense amplifier is commonly coupled to one column of each subarray of the plurality of memory subarrays, further wherein each column of each subarray is coupled to one sense amplifier of the bank of sense amplifiers;

a plurality of local I/O lines coupled to the bank of sense amplifiers;

at least one global I/O line; and at least one multiplexor coupled between the plurality of local I/O lines and the at least one global I/O line, wherein the at least one multiplexor is adapted to selectively isolate the at least one global I/O line from at least a portion of the plurality of local I/O lines carrying sensed and amplified signals from the bank of sense amplifiers.

21. The memory array of claim 20, wherein the at least one multiplexor is adapted to selectively isolate the at least one global I/O line in response to a multiplexor control signal.

22. The memory array of claim 21, wherein the multiplexor control signal is a test signal which is also operative to cause decoding circuitry to ignore subarray selection portions of a memory cell address.

23. A memory array, comprising:
a plurality of memory subarrays, each having memory cells arranged in rows and columns;
a bank of sense amplifiers coupled between the plurality of memory subarrays, wherein each sense amplifier is commonly coupled to one column of each subarray of the plurality of memory subarrays, further wherein each column is coupled to one sense amplifier of the bank of sense amplifiers;
a plurality of local I/O line pairs coupled to the bank of sense amplifiers;
at least one pair of global I/O lines; and
at least one multiplexor coupled between the plurality of local I/O line pairs and the at least one pair of global I/O lines, wherein the at least one multiplexor is adapted to selectively isolate the at least one pair of global I/O lines from at least a portion of the plurality of local I/O line pairs carrying sensed and amplified signals from the bank of sense amplifiers.

24. A memory array, comprising:
a plurality of local I/O lines coupled to memory cells;
a multiplexor coupled to the plurality of local I/O lines; and
a global I/O line coupled to the multiplexor;
wherein the multiplexor is adapted to selectively couple one of the plurality of local I/O lines to the global I/O line when only that one of the plurality of local I/O lines carries a sensed and amplified signal from a memory cell; and
wherein the multiplexor is adapted to selectively isolate the plurality of local I/O lines from the global I/O line when more than one of the plurality of local I/O lines carries a sensed and amplified signal from a memory cell.

25. A method of operating a memory device, comprising:
selectively coupling one of a plurality of local I/O lines to a global I/O line when that one of a plurality of local I/O lines carries a sensed and amplified signal from a memory cell; and
isolating the plurality of local I/O lines from the global I/O line when more than one of the plurality of local I/O lines carries a sensed and amplified signal from a memory cell.

26. The method of claim 25, wherein selectively coupling one of a plurality of local I/O lines to a global I/O line further comprises selectively coupling one of a plurality of local I/O lines to a global I/O line using a multiplexor.

27. The method of claim 26, wherein isolating the plurality of local I/O lines from the global I/O line further comprises isolating the plurality of local I/O lines from the global I/O line using the multiplexor.

28. The method of claim 27, wherein isolating the plurality of local I/O lines from the global I/O line using the multiplexor further comprises isolating the plurality of local I/O lines from the global I/O line using the multiplexor in response to a multiplexor control signal that is independent from subarray and sense amp control signals.

29. A memory device, comprising:
a plurality of data pins;
an addressing circuit responsive to addresses; and
a memory array connected to the plurality of data and the addressing circuit, the memory array comprising:
a plurality of memory subarrays, each having memory cells arranged in rows and columns;
a bank of sense amplifiers coupled between the plurality of memory subarrays, wherein each sense amplifier is commonly coupled to one column of each subarray of the plurality of memory subarrays, further wherein each column of each subarray is coupled to one sense amplifier of the bank of sense amplifiers;
a plurality of local I/O lines coupled to the bank of sense amplifiers;
at least one global I/O line; and
at least one multiplexor coupled between the plurality of local I/O lines and the at least one global I/O line, wherein the at least one multiplexor is adapted to selectively isolate the at least one global I/O line from at least a portion of the plurality of local I/O lines carrying sensed and amplified signals from the bank of sense amplifiers.

30. A memory device, comprising:
a plurality of data pins;
an addressing circuit responsive to addresses; and
a memory array connected to the plurality of data and the addressing circuit, the memory array comprising:
a plurality of local I/O lines coupled to memory cells;
a multiplexor coupled to the plurality of local I/O lines; and
a global I/O line coupled to the multiplexor;
wherein the multiplexor is adapted to selectively couple one of the plurality of local I/O lines to the global I/O line when only that one of the plurality of local I/O lines carries a sensed and amplified signal from a memory cell; and
wherein the multiplexor is adapted to selectively isolate the plurality of local I/O lines from the global I/O line when more than one of the plurality of local I/O lines carries a sensed and amplified signal from a memory cell.

31. A memory array, comprising:
plural subarrays each having memory elements and local lines for accessing their contents;
switching means coupled to the local lines for connecting different ones of them to at least one global line; and
a test signal for isolating all of the local lines at the same time from the at least one global line.

32. The memory array of claim 31 where the test signal further fires multiple ones of the memory elements at the same time.

33. The memory array of claim 31, where the local lines are local I/O lines.

34. The memory array of claim 31, where the global line is a global I/O line.

35. The memory array of claim 31 where the switching means comprises a plurality of multiplexers.

36. The memory array of claim 31 where the memory cells are disposed in multiple banks.

37. The memory array of claim 36 where the test signal further fires multiple ones of the banks at the same time.

38. The memory array of claim 31 where the test signal is coupled to the switching means.

39. The memory array of claim 31 further comprising at least one row address decoder for selecting one row from multiple subarrays to be fired at the same time.

40. The memory array of claim 39 where the switching means are connected to the test signal independently of subarray selection.

41. A memory array, comprising:
plural subarrays each having memory elements;
means for selecting subarrays and rows within subarrays;
means for sensing values stored in the memory elements;
local lines coupled to the sensing means;
switching means coupled to the local lines for connecting different ones of them to at least one global line; and
a test signal for isolating all of the local lines at the same time from the at least one global line.

42. The memory array of claim 41 where each subarray has multiple rows of memory elements.

43. The memory array of claim 42 where the test signal further fires rows in multiple arrays at the same time.

44. The memory array of claim 41 where the sensing means is a sense amplifier.

45. A dynamic random access memory array, comprising:
multiple subarrays each having multiple rows of memory elements;
means for selecting subarrays and rows within subarrays;
a plurality of means for sensing the contents of certain memory cells, each sensing means coupled to a memory element in one row from each of two adjacent subarrays;
local lines coupled to the sensing means;
switching means coupled to the local lines;
at least one global line coupled to the switching means; and
a control line which is independent of the selecting means, the control line isolating all of the local lines at the same time from the at least one global line.

46. The memory array of claim 45 where the control line further fires multiple rows at the same time.

47. A method of testing a memory array having a plurality of subarrays having multiple rows of memory elements and local lines coupled to global lines, the method comprising the steps of:
firing single rows of memory cells in multiple subarrays at the same time; and
at the same time, isolating all the local lines from the global lines.

48. The method of claim 47 further comprising receiving a control signal for firing the cells and isolating the local lines.

49. The method of claim 48 further comprising coupling the local lines to the global lines in the absence of the control signal.

50. The method of claim 49 where the coupling step selects which of the local lines are coupled to the global lines in response to a subarray signal.

* * * * *